United States Patent [19]
Ballman et al.

[11] Patent Number: 5,084,206
[45] Date of Patent: Jan. 28, 1992

[54] DOPED CRYSTALLINE COMPOSITIONS AND A METHOD FOR PREPARATION THEREOF

[75] Inventors: Albert A. Ballman, Toms River, N.J.; John D. Bierlein; August Ferretti, both of Wilmington, Del.; Thurman E. Gier, Chadds Ford, Pa.; Patricia A. Morris, Wilmington, Del.

[73] Assignee: E. I. Du Pont de Nemours and Company, Wilmington, Del.

[21] Appl. No.: 473,771

[22] Filed: Feb. 2, 1990

[51] Int. Cl.$^5$ .............................................. C30B 29/32
[52] U.S. Cl. ................................ 252/301.4 F; 156/621; 156/622; 156/623 R; 156/624; 156/DIG. 70; 156/DIG. 71; 156/DIG. 81; 156/DIG. 85; 252/301.4 P
[58] Field of Search ............... 156/621, 622, 623, 624, 156/DIG. 70, DIG. 71, DIG. 81, DIG. 85, 75; 252/301.4 F, 301.4 P, 29.6; 372/21, 22

[56] References Cited

U.S. PATENT DOCUMENTS

| | | | |
|---|---|---|---|
| 3,949,323 | 4/1976 | Bierlein et al. | 156/623 R |
| 4,231,838 | 11/1980 | Gier | 156/600 |
| 4,305,778 | 12/1981 | Gier | 156/DIG. 75 |
| 4,654,111 | 3/1987 | Laudise | 156/623 R |
| 4,740,265 | 4/1988 | Bierlein et al. | 156/621 |
| 4,746,396 | 5/1988 | Marnier | 156/621 |
| 4,761,202 | 8/1988 | Bordui et al. | 156/622 |
| 4,766,954 | 8/1988 | Bierlein et al. | 156/624 |

FOREIGN PATENT DOCUMENTS 63-40799  7/1988  Japan ..................................... 29/14

OTHER PUBLICATIONS

Morris et al., "Defects in KTiOPO$_4$", Proc. Book MRS Optical Matls., 1989.
R. F. Belt et al., Laser Focus Electro-Optics, 110-124 (Oct. 1985).
Ballman et al., "Growth of Potassium Titanyl Phosphate (KTP) from Molten Tungtate Melts", J. of Crystal Growth 75, 390-394 (1986).
Bordui, P. F., et al., J. Crystal Growth 84, 403-408 (1987).
Belt, R. F. et al., Ceramics and Inorganic Crystals for Optics, Electro-Optics and Nonlinear Conversion 968, 100-107 (1988).
Loiacono, G. M. et al., Second Harmonic Generation Material Development, Electronics Tech. Lab, Wright Patterson AFB (1989).
Belt, R. F. et al., Nonlinear Optical Materials for Second Harmonic Generation (KTP)—Phase I: Preparation of 5 mm Cubes, Avionics Laboratory, Wright-Patterson AFB (1984).
G. Blasse et al., "The Luminescence of KTiOPO$_4$:Nb, Ga", Mat. Res. Bull. (24), pp. 1099-1102 (1989).
Vassillikona-Dova, "EPR of VO$^{2+}$ IN KTIOPO$_4$ Single Crytals", Z. Naterforsch A: Phys. Sci., vol. 49, No. 8, 1989, pp. 711-714.
Laudise et al., "Phase Relations, Solubility, and Growth of Potassium Titanyl Phosphate, KTP", Journal of Crystal. Growth, vol. 74 (1986), pp. 275-280.
Jacco et al., "Flux Growth and Properties of KTiOPO$_4$", Journal of Crystal Growth, vol. 70 (1984), pp. 484-488.

*Primary Examiner*—Robert Kunemund

[57] ABSTRACT

A composition is disclosed which consists essentially of doped crystalline MTiOXO$_4$ (wherein M is selected from the group consisting of K, Rb and Tl, X is selected from the group consisting of P and As) which contain at least about 100 ppm total of at least one dopant selected from the group consisting of Ga, Al and Si. The compositions generally have low ionic conductivity, and may be prepared using an improved flux process wherein Ga, Al and/or Si dopant is added to the flux in a total amount of at least about 0.5 mole % and the crystallization temperature is controlled to provide a crystalline composition containing the desired amount of dopant.

45 Claims, 1 Drawing Sheet

5,084,206

DOPED CRYSTALLINE COMPOSITIONS AND A METHOD FOR PREPARATION THEREOF

FIELD OF THE INVENTION

This invention relates to crystals having the structure of $KTiOPO_4$ and their preparation using flux growth procedures, and more particularly to the use of selected dopants to provide crystals having reduced ionic conductivity.

BACKGROUND OF THE INVENTION

Crystals of $KTiOPO_4$ and its analogs are considered highly useful because of their nonlinear optical properties. U.S. Pat. No. 3,949,323 teaches the use of flaw-free crystals r optical devices. Recently higher AC conductivity has been correlated with increased damage to crystals. See Morris et al., "Defects in $KTiOPO_4$", Proc. Book MRS Optical Matls., 1989. Relatively large crystals with low ionic conductivity are thus considered particularly desirable for many optical applications. Since $KTiOPO_4$ and its analogs are known to decompose upon melting, hydrothermal and flux methods have commonly been used to grow crystals of these compounds. U.S. Pat. No. 3,949,323, as well as others teach preparation of the crystals by hydrothermal methods. Indeed, despite the requirement for high pressures (on the order of hundreds of atmospheres), high temperatures, and relatively long crystal growth times, the art has generally conveyed a preference for hydrothermal methods of crystal growth. See R. A. Laudise et al., J. Crystal Growth 74, 275–280 (1986). R. F. Belt et al, Laser Focus Electro-Optics, 110–124 (October 1983) specifically advises methods other than hydrothermal.

A desire for larger crystal size, better quality and greater durability, as well as the disadvantages of hydrothermal processes have led to continued interest in flux growth techniques and to the development of a variety of flux processes. In U.S. Pat. No. 4,231,838 crystal growth is carried out by heating certain mixtures of $MTiOXO_4$ with a nonaqueous flux $M/X/O$ (where M is selected from K, Tl, and Rb and X is selected from P and As) or their precursors to produce a nonaqueous melt. Crystal growth is affected by the use of a temperature gradient or by slow cooling of the melt at a rate of not greater than 5° C./hour. This flux process reportedly provides an economical, low pressure process which may be used as an advantageous alternate to hydrothermal processes. A substantially isothermal process for producing flaw-free single crystals of $MTiOXO_4$, wherein M and X are defined as above, is described in U.S. Pat. No. 4,761,202. This method involves heating certain melts of $MTiOXO_4$ and a flux of M and X oxides to the seeding temperature, suspending a seed crystal of $MTiOXO_4$ in the melt, slowly decreasing the temperature of the melt while maintaining substantially isothermal conditions, and continuing the temperature decrease until the desired crystallization of $MTiOXO_4$ on the seed is completed. This method produces relatively large crystals. The ionic conductivities of the crystals resulting from flux processes can be undesirably high for many optical applications (e.g., greater than $10^{-6}$ ohm-cm$^{-1}$,).

Some flux growth methods have included the use of other fluxes to improve various aspects of crystal production. The use of tungstic anhydride is described by Ballman, et al., "Growth of Potassium Titanyl Phosphate (KTP) from Molten Tungstate Melts" J. of Crystal Growth 75, 390–394 (1986) to improve the yield of quality crystals. Japanese Patent 63 40,799 discloses that the use of certain tungsten, molybdenum, chromium and sulfur based fluxes avoids prolonged retention time and suppresses precipitation of black plate-shaped crystals. There remains a need for methods to conveniently reduce the ionic conductivity of $KTiOPO_4$-based optical crystals.

SUMMARY OF THE INVENTION

This invention provides for a doped single crystal of $MTiOXO_4$ containing at least about 100 ppm of a dopant selected from the the group consisting of Ga, Al, Si or mixtures thereof, wherein M is selected from the group consisting of K, Rb and Tl and X is selected from the group consisting of P and As.

This invention more generally provides for a composition consisting essentially of doped crystalline $MTiOXO_4$ which contains at least about 100 ppm total of at least one dopant selected from the the group consisting of Ga, Al and Si, wherein M is selected from the group consisting of K, Rb and Tl and X is selected from the group consisting of P and As. This invention further provides a flux process for producing a substantially flaw-free doped single crystal of $MTiOXO_4$, wherein M is selected from the group consisting of K, Rb and Tl and X is selected from the group consisting of P and As, which contains at least about 100 ppm total of at least one dopant selected from the the group consisting of Ga, Al and Si by (1) preparing a substantially isothermal melt containing the components for forming $MTiOXO_4$ crystals, a flux of M and X oxides and at least one oxide selected from the group consisting of Ga, Al and Si, in an amount of at least about 0.5 mole %, preferably at least about 1 mole %, calculated as the oxide and based on the total moles of $MTiOXO_4$, and heating the melt to the seeding temperature, (2) suspending a seed crystal of $MTiOXO_4$ in the melt, (3) slowly decreasing the temperature of the melt while maintaining substantially isothermal conditions therein, and (4) continuing decreasing the temperature until crystallization of the doped $MTiOXO_4$ crystal is completed. A further improvement for producing particularly high quality crystalline composition of the invention resides in providing a means for mixing the flux surrounding the seed crystal in the melt.

Crystals of this invention have an ionic conductivity of less than $10^{-6}$ ohm-cm$^{-1}$; and have more desirable properties (e.g. enhanced damage resistance) for many optical applications. Such crystals can be conveniently prepared by this process.

DETAILED DESCRIPTION OF THE INVENTION

Figure 1:
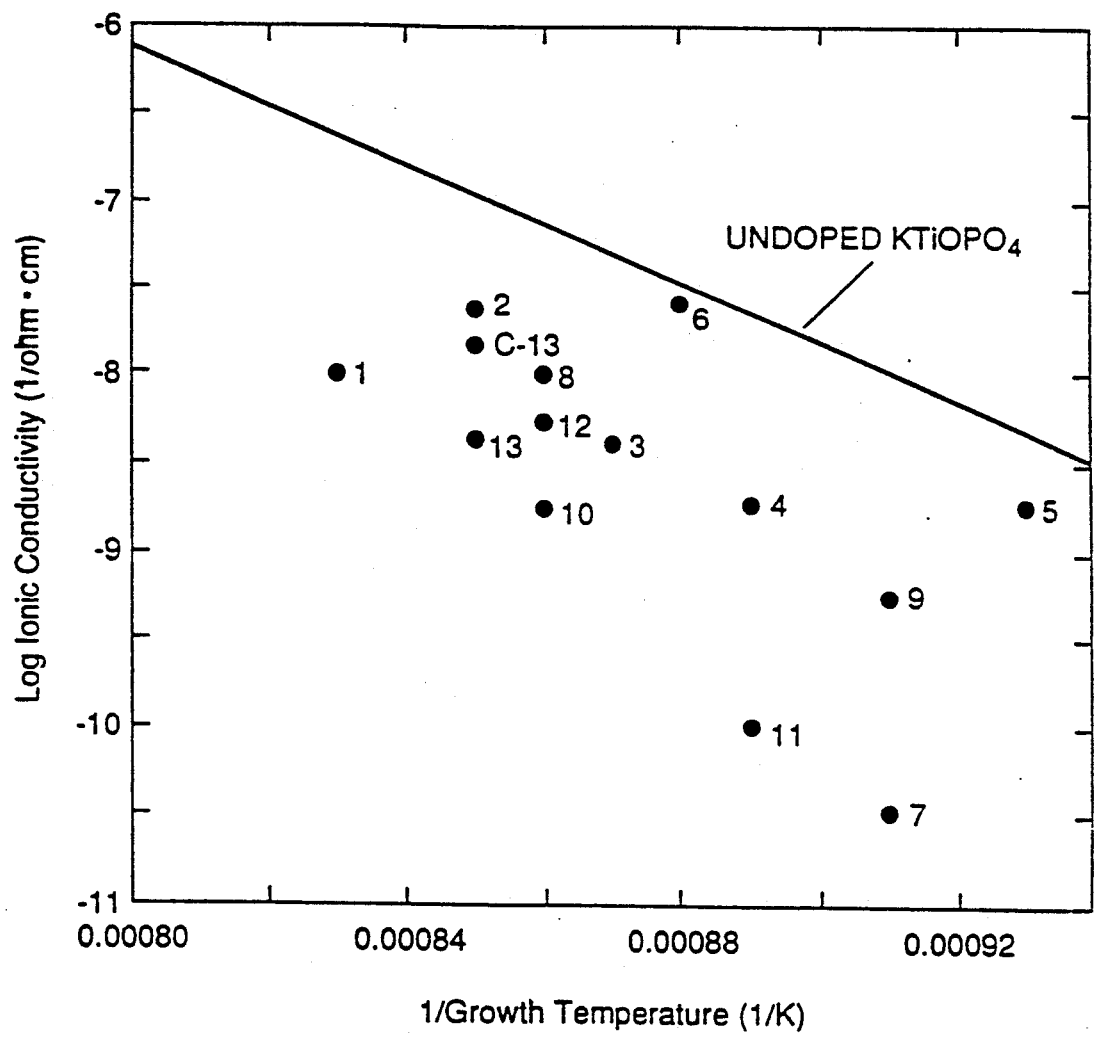
FIG. 1 is a plot of the $\log_{10}$ of the ionic conductivity versus the reciprocal of the growth temperature in degrees Kelvin for doped crystals of the invention and for comparative undoped crystals.

A crystal of this invention has the orthorhomic structure of $KTiOPO_4$ with a $Pna2_1$ space group. In accordance with this invention, a small but effective amount of a dopant selected from the group consisting of Ga, Al, Si or mixtures thereof is incorporated within the crystalline structure. It is preferred that the Ga, Al and Si be uniformly incorporated into the crystalline structure in amounts totaling at least about 100 ppm.

Compositions are provided in accordance with this invention which consist essentially of doped crystalline $MTiOXO_4$ (wherein M is selected from the group consisting of K, Rb and Tl and X is selected from the group consisting of P and As) which contains at least one dopant selected from the group consisting of Ga, Al and Si. Preferably the doped crystalline $MTiOXO_4$ is a single crystal. The doped crystalline compositions of this invention are considered superior for many applications to undoped $MTiOXO_4$ crystals grown under the same conditions because they exhibit reduced ionic conductivity and reduced susceptibility to damage.

The crystalline composition of the invention preferably contains at least 100 ppm, and more preferably contains at least about 200 ppm, of a dopant selected from the group consisting of Ga, Al, Si and mixtures thereof. The upper limit can be as high as the solubility of the dopant used in its preparation (i.e., Ga, Al and/or Si) in the $MTiOXO_4$-based crystal structure at the temperature of preparation. In general the upper limit is about 5000 ppm.

The process of this invention for producing a doped single crystal of $MTiOXO_4$ can employ conventional flux process steps for producing a crystalline composition, including preparing a substantially isothermal melt containing the components for forming $MTiOXO_4$ crystals and a flux comprising oxides of M and X; suspending a seed crystal of $MTiOXO_4$ in the melt; slowly decreasing the temperature of the melt while maintaining substantially isothermal conditions therein; and continuing decreasing the temperature until crystallization of the crystalline composition is completed. The components for forming $MTiOXO_4$ crystals are well known in the art (see, for example, U.S. Pat. No. 4,231,838 and U.S. Pat. No. 4,761,202, which are hereby incorporated by reference); and include oxides of Ti, M and X, the precursors of the oxides of Ti, M and X, and materials composed of mixtures of the oxides and/or precursors of the oxides of Ti, M and X. According to the process of this invention, however, an improvement is provided whereby Ga, Al and/or Si dopant is added to the flux in a total amount of at least about 0.5 mole %, and preferably at least about 1 mole %, calculated as the oxide and based on the total moles of $MTiOXO_4$ formable from the components in the melt; and the crystallization temperature is controlled to provide a doped single crystal of $MTiOXO_4$ which contains at least about 100 ppm total of Ga, Al and/or Si. The upper limit of the Ga, Al and/or Si dopant is limited only by the melt temperature and can be as high as 20 mole %. The range typically used is in the range of 3 mole % to 8 mole %. Since the actual amount of Ga, Al and/or Si in the crystal composition is limited principly by the solubility of these dopants in the $MTiOXO_4$ crystal, there is generally no significant advantage in using excessive amounts of these dopants in the melt. The resulting crystals have reduced ionic conductivity compared to crystals formed without adding said dopant. Indeed crystals which generally exhibit an ionic conductivity of less than $10^{-6}$ ohm-cm$^{-1}$ can be conveniently prepared by the process of this invention. These crystals are considered to have more desirable properties (e.g. enhanced damage resistance) for many optical applications.

The seeding temperature of the process of this invention (i.e. the temperature of the melt when the seed crystal of $MTiOXO_4$ is suspended therein) is preferably within the range of from about 700° C. to about 990° C., and more preferably is within the range of from about 800° C. to about 980° C.

Referring to FIG. 1, the solid line illustrates the decrease in ionic conductivity of undoped $KTiOPO_4$, i.e., $KTiOPO_4$ without the Ga, Al and/or Si additives of the invention, as the growth temperature decreases (i.e., as the reciprocal of the growth temperature increases). This line was determined by measuring the ionic conductivities of multiple samples of undoped $KTiOPO_4$ crystals grown over temperature ranges with midpoint growth temperatures of approximately 945° C., 757° C. and 716° C. and drawing the line which "best-fits" the data. Variations in defect concentrations and ionic conductivities exist as a result of the growth occurring over a range of temperatures. While it is possible to obtain desirably low ionic conductivities by using lower growth temperatures, growth times can become so long as to be impractical. The numbers on FIG. 1 represent the data for crystal compositions prepared in accordance with this invention and correspond to the Examples which follow. These data points were chosen from the results obtained for multiple samples of each crystal as the data most representative of the average conductivity of the crystal. Variations in ionic conductivities exist as a result of the temperature dependence of defect concentrations as described above as well as the temperature dependence of dopant concentrations, both of which exist as a result of growth occurring over a range of temperatures. The data in FIG. 1 show that desirably low ionic conductivities can be achieved by the practice of this invention at growth temperatures where the growth rates are practical. In addition the resulting crystal compositions exhibit more desirable properties (e.g. enhanced damage resistance) for many optical applications.

The process of the invention can be practiced in any apparatus which calls for the maintenance of substantially isothermal conditions in the melt while suspending the seed crystal therein. A suitable apparatus for the practice of this invention is described in above-referenced U.S. Pat. No. 4,761,202, which has been incorporated herein. It is preferred in the practice of this invention to provide for mixing of the melt during the substantially isothermal crystallization in order to provide uniform distribution of the dopant through the melt. A particularly suitable way to accomplish this is to provide a means for enhancing the uniformity of distribution of the dopant in the melt (e.g. by providing a paddle on the end of the device which holds the seed crystal in the melt and rotating the device during crystallization; or rotating the crucible in which the melt is contained). In this way the melt can be mixed more effectively than the mixing provided by merely rotating the small seed crystal per se.

Doped single crystals of $MTiOXO_4$ within the scope of this invention contain at least about 100 ppm total of at least one dopant selected from the group consisting of Ga, Al and Si. A doped $MTiOXO_4$ crystal of this invention, like a useful undoped $MTiOXO_4$ crystal, can contain various impurities as a result of impure starting materials, the fluxes used in the crystal preparation, etc., so long as these impurities are not present in an amount which substantially interferes with the performance of the crystal. For example, the crystalline composition may contain minor amounts of impurities such as iron. The crystalline compositions may also be produced by methods such as spontaneous nucleation from a flux; and fluxes based on materials such as tungsten or molybdenum may be employed. Accordingly, the crystalline compositions of this invention can also contain materials such as tungsten or molybdenum which can be present as a result of the production technique, again, so long as these impurities are not present in an amount which substantially interferes with the performance of the crystal.

Practice of the invention is further illustrated by the following non-limiting examples.

EXAMPLES

General Procedure

Quantities of $TiO_2$ $K_2HPO_4$ and $KHPO_4$ chosen to provide components to form 1 mole of $KTiOPO_4$ plus a K/P/O solvent were melted down in a 200 cc platinum crucible in air. The preliminary melting was carried out in a muffle furnace to facilitate the stepwise addition of the ingredients to compensate for the decrease in volume resulting from water loss on melting. After the addition of the initial ingredients, i.e. $TiO_2$, $K_2HPO_4$ and $KHPO_4$, was completed, the desired amounts of the oxide(s) $Ga_2O_3$, $Al_2O_3$, and/or $SiO_2$ were added to the melt in the platinum crucible and the contents of the crucible were transferred to a vertical tube furnace. The mixture was remelted and mixed with a platinum paddle overnight. If the melting appeared to be incomplete as indicated by floating solids or materials visible through the melt on the bottom of the crucible, the temperature was increased slowly stepwise until solution was complete. When a clear solution was obtained, the paddle was removed and the temperature of the furnace decreased slowly stepwise until an island of solid appeared on the surface of the melt. At that point the furnace temperature was raised slowly again until the solid disappeared. After allowing the temperature to stabilize for approximately 16-24 hours, the melt temperature was measured using a platinum clad thermocouple. A seed crystal of $KTiOPO_4$ was then inserted into the crucible and positioned 10-50 mm beneath the surface of the melt. A platinum paddle was attached to the seed holder to permit mixing of the melt during the growth process. While some spurious nucleation did occur on the surfaces of the paddle, the paddle provided a means of effectively mixing the melt in addition to the minor mixing inherently produced by rotation of the small seed crystal. The seed holder containing the seed crystal was rotated overnight in the melt which was held at a constant temperature. The furnace temperature was then slowly decreased, i.e., programmed down, to provide a constantly supersaturated solution. After cooling through a predetermined temperature range, typically a decrease in temperature of from about 20° C. to about 50° C., the resulting crystal composition was withdrawn from the melt and slowly moved out of the hot zone of the furnace. At the end of the run the melt temperature was measured using a platinum clad thermocouple.

The resulting crystal composition was analyzed by ICP (Inductively Coupled Plasma Emission Spectroscopy) to determine the amount in ppm by weight of Ga, Al and/or Si contained therein. Different measurement techniques can result in different dopant level results for a given sample particularly at low concentrations; for the purposes herein ppm is determined by ICP.

The ionic conductivity of the crystal was measured in a conventional manner as follows: Wafers of the crystal to be tested were cut with the Z-axis normal to the top and bottom faces of the wafer and with dimensions of typically of a few mm's on a side and one mm thick. The top of bottom surfaces were electroded with evaporated aluminum or gold metal. Two terminal measurements were done at room temperature in air using a Genrad GR1689 RLC bridge in parallel circuit mode with a Hewlett Packard 16034E test fixture. Short and open calibrations were done for the instrument. The capacitance of the holder was measured and zeroed out prior to all measurements. The capacitance and loss tangent are measured at 13 Hz. The AC conductivity, i.e., ionic conductivity, was calculated from the capacitance and loss tangent using the following formula:

$$AC\ Conductivity\ (ohm\text{-}cm)^{-1} = (t/A)*2\pi\omega*C_p*D$$

where t is thickness of the wafer, A is the area of the top or bottom surface of the wafer; $\omega$ is the frequency of the applied electric field; $C_p$ is the measured capacitance and D is the loss tangent.

EXAMPLES 1-5

The crystals of Examples 1 through 5 were made in accordance with the General Procedure above. A solution of the components necessary to form one mole of $KTiOPO_4$ and K/P/O solvent was formed by melting 1.16 moles of $K_2HPO_4$, 2.16 moles of $KH_2PO_4$ and 1.0 mole of $TiO_2$. Then 3 mole % of $Ga_2O_3$ was added to the melt. The temperature of the melt when the seed crystal is suspended therein is the highest temperature in the respective temperature range shown in Table 1, the melt is cooled through the respective temperature range, and the crystal is withdrawn from the melt at the lowest temperature in the respective temperature range. The resulting crystals were analyzed for Ga content and found to contain the Ga (ppm) shown in Table 1. (The range of dopant concentrations indicated for Examples 1, 3 and 4, result from multiple analyses.) The ionic conductivities for the crystals produced in each example are also shown in Table 1, along with the reciprocal of the Kelvin Scale (K) temperature, 1/T at the midpoint of the temperature range. A plot of the log of the ionic conductivity as a function of 1/T is shown in FIG. 1 and the results for each Example is shown by the corresponding number 1 through 5 in FIG. 1.

EXAMPLES 6-7

The crystals of Examples 6 and 7 were made using essentially the same procedure used for Examples 1-5, except that twice as much $Ga_2O_3$ was used (i.e., 6 mole %) and the temperature ranges were as shown in Table 1. The results for each example are recorded in Table 1 and plotted as points 6 and 7 in FIG. 1.

EXAMPLE 8

The crystal of Example 8 was made using essentially the same procedure used for Examples 1-5 except that 3 mole % of $Al_2O_3$ was used instead of $Ga_2O_3$ and the temperature range was as shown in Table 1. The results are recorded in Table 1 and plotted as point 8 in FIG. 1.

EXAMPLE 9

The crystal of Example 9 was made using the procedure for Examples 1-5 except that 1 mole % of $SiO_2$ was used instead of $Ga_2O_3$ and the temperature range was as shown in Table 1. The results are recorded in Table 1 and plotted as point 9 in FIG. 1.

EXAMPLES 10-12

The crystals of Examples 10, 11 and 12 were made using the procedure for Examples 1-5 except that in addition to the 3 mole % of $Ga_2O_3$, mole % of $SiO_2$ was also used, and the temperature range was as shown in Table 1. The results for each run are recorded in Table 1 and plotted as points 10, 11 and 12 in FIG. 1.

EXAMPLE 13 AND C-13

The crystal of Example 13 was made using the procedure for Examples 1-5 except that 3.24 moles of $KH_2AsO_4$, 2.34 moles of $KHCO_3$ and 1.0 mole of $TiO_2$ (i.e. the components for forming $KTiOAsO_4$) were used to provide one mole of $KTiOAsO_4$ in a K/As/O solvent, and the temperature range was as shown in Table 1. The results for run 13 are recorded in Table 1, and plotted as point 13 in FIG. 1.

For comparison an undoped crystal sample of $KTiOAsO_4$ was prepared using the same procedure as Example 13, except that 2.85 moles of $KH_2AsO_4$, 1.85 moles of $KHCO_3$ and 1.0 mole of $TiO_2$ were used to form the melt and no Ga dopant was added, and the temperature range was as shown in Table 1. The results for this sample are also recorded in Table 1, and plotted as point C-13 in FIG. 1.

EXAMPLE 14

A molybdate flux was prepared by combining 82 g (0.6 M) $KH_2PO_4$, 71 g (0.3 M) of $K_2MoO_4$, 17 g (0.1 M) of $Li_2MoO_4$, 24 g (0.3 M) of $TiO_2$ and 1 g (0.004 M) of $Ga(NO_3)_3$ in a platinum crucible and heated to 1005° C. for 48 hours. The resulting flux was then cooled at 0.7° C. per hour to a temperature of 650° C. Fifty-three grams of fair quality crystals of potassium titanyl phosphate were isolated and found by inductively coupled plasma emission spectroscopy to contain 195 micrograms/gram of Ga, less than 30 micrograms/gram of Fe, and 210 micrograms/gram of Mo, based on the grams of potassium titanyl phosphate formed. A portion of the crystals had a slightly purple tinge. The doped crystalline Ga composition was found to have very low conductivity.

TABLE 1

| Ex. No. | Amount of Elemental Dopant (ppm) | Temperature Range (°C.) | $1/T \times 10^{-3}$ (1/°K.) | Ionic Conductivity $(ohm-cm)^{-1}$ |
|---|---|---|---|---|
| 1 | 300-375 (Ga) | 921-896 | 0.85 | $2.34 \times 10^{-8}$ |
| 2 | 652 (Ga) | 940-925 | 0.83 | $9.51 \times 10^{-9}$ |
| 3 | 285-367 (Ga) | 863-830 | 0.89 | $1.83 \times 10^{-9}$ |
| 4 | 240-330 (Ga) | 894-864 | 0.87 | $4.14 \times 10^{-9}$ |
| 5 | 270 (Ga) | 829-780 | 0.93 | $1.86 \times 10^{-9}$ |
| 6 | 600 (Ga) | 868-850 | 0.88 | $2.58 \times 10^{-8}$ |
| 7 | 550 (Ga) | 850-804 | 0.91 | $3.39 \times 10^{-11}$ |
| 8 | 200 (Al) | 906-881 | 0.86 | $9.76 \times 10^{-9}$ |
| 9 | 2000 (Si) | 855-805 | 0.91 | $5.66 \times 10^{-10}$ |
| 10 | 580 (Ga) (Si)[1] | 925-888 | 0.86 | $1.73 \times 10^{-9}$ |
| 11 | 330 (Ga) 150 (Si) | 864-835 | 0.89 | $1.01 \times 10^{-10}$ |
| 12 | 395 (Ga) 2900 (Si) | 914-875 | 0.86 | $5.25 \times 10^{-9}$ |
| 13 | 700 (Ga) in $KTiOAsO_4$ | 929-873 | 0.85 | $4.27 \times 10^{-9}$ |
| C-13 | undoped $KTiOAsO_4$ | 924-867 | 0.85 | $1.44 \times 10^{-8}$ |

[1] No Si was detected for the example.

The Examples include particular embodiments of the invention. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A composition consisting essentially of doped crystalline $MTiOXO_4$ wherein M is selected from the group consisting of K, Rb and Tl, and X is selected from the group consisting of P and As, said $MTiOXO_4$ being crystallized from a flux and containing at least one dopant selected from the group consisting of Ga, Al and Si in an amount, totaling at least about 100 ppm, effective to reduce the ionic conductivity of the doped crystalline composition compared to a crystalline composition without said dopant.

2. The composition of claim 1 containing at least about 200 ppm of said at least one dopant.

3. The composition of claim 2 wherein said doped crystalline $MTiOXO_4$ is a single crystal.

4. The composition of claim 3 wherein the dopant is Ga.

5. The composition of claim 3 wherein the dopant is Al.

6. The composition of claim 3 wherein the dopant is Si.

7. The composition of claim 3 in which the dopant is a mixture of Ga and Si.

8. The composition of claim 3 wherein X is P.

9. The composition of claim 3 wherein X is As.

10. The composition of claim 3 wherein M is K.

11. The composition of claim 10 wherein X is P.

12. The composition of claim 11 wherein the dopant is Ga.

13. The composition of claim 11 wherein the dopant is Al.

14. The composition of claim 11 wherein the dopant is Si.

15. The composition of claim 11 wherein the dopant is a mixture of Ga and Si.

16. The composition of claim 10 wherein X is As.

17. The composition of claim 16 wherein the dopant is Ga.

18. In a process for producing a single crystal of $MTiOXO_4$, wherein M is selected from the group consisting of K, Rb, and Tl, X is selected from the group consisting of P and As, comprising the steps of preparing a substantially isothermal melt containing the components for forming $MTiOXO_4$ crystals and a flux comprising oxides of M and X; suspending a seed crystal of $MTiOXO_4$ in the melt; slowly decreasing the temperature of the melt; and continuing decreasing the temperature until crystallization of the crystalline composition is completed; an improvement for reducing the ionic conductivity of the single crystal comprising adding to the flux at least about 0.5 mole percent total of at least one dopant selected from the group consisting of Ga, Al and Si, calculated as the oxide and based upon the total moles of $MTiOXO_4$ crystals formable from the components in the melt; and controlling the crystallizing temperature to provide a doped single crystal of $MTiOXO_4$ which contains said dopant in an amount, totaling at least about 100 ppm, effective to reduce the ionic conductivity of the single crystal compared to a single crystal prepared without adding said dopant.

19. The improved process of claim 18 wherein the temperature of the melt when the seed crystal is suspended therein is within the range of from about 700° C. to about 990° C.; and wherein mixing is provided during crystallization.

20. The improved process of claim 19 wherein the components for forming $MTiOXO_4$ crystals comprise $TiO_2$, $K_2HPO_4$ and $KHPO_4$; and at least about 1 mole % to $Ga_2O_3$, $Al_2O_3$, $SiO_2$ or a mixture of $Fa_2O_3$ and $SiO_2$ is added to the flux.

21. The improved process of claim 19 wherein the components for forming $MTiOXO_4$ crystals comprise $KH_2AsO_4$, $KHCO_3$ and $TiO_2$; and at least about 1 mole % of $Ga_2O_3$ is added to the flux.

22. A doped single crystal of $MTiOXO_4$ containing at least about 100 ppm of a dopant selected from the group consisting of Ga, Al, Si or mixtures thereof, wherein M is selected from the group consisting of K, Rb and Tl and X is selected from the group consisting of P and As.

23. The doped single crystal of claim 22 wherein said dopant is present in an amount, at least about 200 ppm, effective to reduce the ionic conductivity of the single crystal compared to crystals without said dopant.

24. The doped single crystal of claim 23 wherein the dopant is Ga.

25. The doped single crystal of claim 23 wherein the dopant is Al.

26. The doped single crystal of claim 23 wherein the dopant is Si.

27. The doped single crystal of claim 23 in which the dopant is a mixture of Ga and Si.

28. The doped single crystal of claim 23 wherein X is P.

29. The doped single crystal of claim 23 wherein X is As.

30. The doped single crystal of claim 23 wherein M is K.

31. The doped single crystal of claim 30 wherein X is P.

32. The doped single crystal of claim 31 wherein the dopant is Ga.

33. The doped single crystal of claim 31 wherein the dopant is Al.

34. The doped single crystal of claim 31 wherein the dopant is Si.

35. The doped single crystal of claim 31 wherein the dopant is a mixture of Ga and Si.

36. The doped single crystal of claim 30 wherein X is As.

37. The doped single crystal of claim 36 wherein the dopant is Ga.

38. The doped single crystal of claim 22 wherein said single crystal is produced by preparing a substantially isothermal melt containing the components for forming $MTiOXO_4$ crystals and a flux comprising oxides of M and X; adding to the flux at least about 0.5 mole percent total of at least one dopant selected from the group consisting of Ga, Al and Si, calculated as the oxide and based upon the total moles of $MTiOXO_4$ crystals formable from the components in the melt; suspending a seed crystal of $MTiOXO_4$ in the melt; slowly decreasing the temperature of the melt while maintaining substantially isothermal conditions therein; and continuing decreasing the temperature until crystallization of the crystalline composition is completed while controlling the crystallizing temperature to provide a doped single crystal of $MTiOXO_4$ which contains said dopant.

39. The composition of claim 3 wherein the doped crystalline $MTiOXO_4$ is produced by preparing a substantially isothermal melt containing the components for forming $MTiOXO_4$ crystals and a flux comprising oxides of M and X; adding to the flux at least about 0.5 mole percent total of at least one dopant selected from the group consisting of Ga, Al and Si, calculated as the oxide and based upon the total moles of $MTiOXO_4$ crystals formable from the components in the melt; suspending a seed crystal of $MTiOXO_4$ in the melt; slowly decreasing the temperature of the melt while maintaining substantially isothermal conditions therein and continuing decreasing the temperature until crystallization of the crystalline composition is completed while controlling the crystallizing temperature to provide a doped single crystal of $MTiOXO_4$ which contains said dopant.

40. A composition consisting essentially of doped crystalline $MTiOXO_4$ wherein M is selected from the group consisting of K, Rb and Tl, and X is selected from the group consisting of P and As, said $MTiOXO_4$ containing at least about 100 ppm total of dopant selected from Al, Si, mixtures thereof and mixtures thereof with Ga.

41. The composition of claim 40 wherein said doped crystalline $MTiOXO_4$ is a single crystal.

42. The composition of claim 41 containing at least about 200 ppm of said at least one dopant.

43. The composition of claim 41 wherein the dopant is Al.

44. The composition of claim 41 wherein the dopant is Si.

45. The composition of claim 41 wherein the dopant is a mixture of Ga and Si.

* * * * *